United States Patent
Thompson et al.

(10) Patent No.: US 7,457,605 B2
(45) Date of Patent: Nov. 25, 2008

(54) LOW NOISE IMAGE REJECT MIXER AND METHOD THEREFOR

(75) Inventors: Charles D. Thompson, Buda, TX (US); Edward Kim Fung Lee, Fullerton, CA (US)

(73) Assignee: Silicon Laboratories, Inc., Austin, TX (US)

( * ) Notice: Subject to any disclaimer, the term of this patent is extended or adjusted under 35 U.S.C. 154(b) by 692 days.

(21) Appl. No.: 10/938,915

(22) Filed: Sep. 10, 2004

(65) Prior Publication Data

US 2006/0057983 A1    Mar. 16, 2006

(51) Int. Cl.
*H04B 1/26* (2006.01)
*H04B 1/10* (2006.01)

(52) U.S. Cl. .................. 455/313; 455/285; 455/326

(58) Field of Classification Search .................. 455/313, 455/318, 326, 285, 127.3, 296, 196.1, 76, 455/260
See application file for complete search history.

(56) References Cited

U.S. PATENT DOCUMENTS

| | | | |
|---|---|---|---|
| 3,984,783 A | 10/1976 | Bickley | |
| 4,317,083 A | 2/1982 | Boyd | |
| 4,344,043 A | 8/1982 | Harford | |
| 5,384,501 A | 1/1995 | Koyama et al. | |
| 6,035,186 A | 3/2000 | Moore et al. | |
| 6,047,167 A | 4/2000 | Yamashita | |
| 6,144,845 A * | 11/2000 | Durec | 455/285 |
| 6,278,321 B1 | 8/2001 | Franck | |
| 6,324,388 B1 * | 11/2001 | Souetinov | 455/302 |
| 6,342,813 B1 | 1/2002 | Imbornone et al. | |
| 6,366,166 B1 | 4/2002 | Belot | |
| 6,414,547 B1 | 7/2002 | Shkap | |
| 6,480,058 B2 | 11/2002 | Blanken | |
| 6,489,838 B1 | 12/2002 | Tsinker | |
| 6,529,100 B1 | 3/2003 | Okanobu | |
| 6,605,996 B2 | 8/2003 | Yu et al. | |
| 6,606,489 B2 * | 8/2003 | Razavi et al. | 455/323 |
| 6,639,468 B2 | 10/2003 | Belot | |
| 6,717,474 B2 * | 4/2004 | Chen et al. | 330/301 |
| 6,724,252 B2 | 4/2004 | Ngo et al. | |
| 6,735,420 B2 | 5/2004 | Baldwin | |
| 6,735,424 B1 | 5/2004 | Larson et al. | |

(Continued)

FOREIGN PATENT DOCUMENTS

EP    1 134 891 A    9/2001

OTHER PUBLICATIONS

Hornak, Tom, "Using Polyphase Filters As Image Attenuators." RF Signal Processing, www.rfdesign.com, pp. 26-34, Jun. 2001.

(Continued)

*Primary Examiner*—Sonny Trinh
(74) *Attorney, Agent, or Firm*—Larson Newman Abel & Polansky, LLP

(57) ABSTRACT

A receiver (200) includes a transconductance mixer (310), a polyphase filter (320), and a transimpedance amplifier (330). The transconductance mixer (310) mixes a radio frequency (RF) voltage signal into a current signal having a plurality of phases using a local oscillator signal. The polyphase filter (320) filters the current signal to provide a filtered current signal. The transimpedance amplifier (330) converts the filtered current signal into an output voltage signal.

38 Claims, 6 Drawing Sheets

U.S. PATENT DOCUMENTS

| | | | |
|---|---|---|---|
| 6,756,848 B2 | 6/2004 | Garcia et al. | |
| 6,909,886 B2 * | 6/2005 | Magnusen et al. | 455/307 |
| 6,982,584 B2 * | 1/2006 | Melly | 327/254 |
| 7,016,664 B2 * | 3/2006 | Souetinov | 455/323 |
| 7,116,961 B2 * | 10/2006 | Kamata et al. | 455/296 |
| 2005/0197090 A1 * | 9/2005 | Stockstad et al. | 455/313 |
| 2006/0046683 A1 * | 3/2006 | Goddard | 455/343.5 |

OTHER PUBLICATIONS

Lee, Thomas H., "The Design of CMOS Radio-Frequency Integrated Circuits." The Press Syndicate of the University of Cambridge, New York, NY, pp. 556-561, pp. 288-2295, 1998.

"900MHZ Image-Reject Transceivers," Maxim Integrated Products, Sunnyvale, California, 19-1234, Rev. 5, Aug. 2003pp. 1-14.

* cited by examiner

LOW NOISE IMAGE REJECT MIXER AND METHOD THEREFOR

CROSS REFERENCE TO RELATED APPLICATIONS

Related subject matter is contained in patent Application No. 10/779,100, filed on Feb. 11, 2004, now U.S. Patent No. 7,081,796, issued Jul. 26, 2006, entitled "Radio Frequency Low Noise Amplifier with Automatic Gain Control" invented by Andrew W. Krone and assigned to the assignee hereof.

TECHNICAL FIELD

The present invention generally relates to frequency conversion circuits, and more particularly to mixers.

BACKGROUND

Radio frequency (RF) receivers are used in a wide variety of applications such as television, cellular telephones, pagers, global positioning system (GPS) receivers, cable modems, cordless phones, satellite radio receivers, and the like. As used herein, a "radio frequency" signal means an electrical signal conveying useful information and having a frequency from about 3 kilohertz (kHz) to thousands of gigahertz (GHz), regardless of the medium through which such signal is conveyed. Thus an RF signal may be transmitted through air, free space, coaxial cable, fiber optic cable, etc. One common type of RF receiver is the so-called superheterodyne receiver. A superheterodyne receiver mixes the desired data-carrying signal with the output of tunable oscillator to produce an output at a fixed intermediate frequency (IF). The fixed IF signal can then be conveniently filtered and converted back down to baseband for further processing. Thus a superheterodyne receiver requires two mixing steps.

One well-known problem with the mixing process is that it creates image signals. For some RF systems the level of the image signal is small enough so that designers can rely on the attenuation characteristics of an RF bandpass filter alone to reject image signals. However for other systems the attenuation of the RF bandpass filter is not sufficient. For example satellite radio uses a 2.3 GHz carrier frequency. Each channel has a baseband spectrum from 1 megahertz (MHz) to about 13 MHz, and the adjacent signal spectra can create large image signals. In these systems additional image rejection filtering is required to maintain a sufficient signal-to-noise ratio (SNR) in the desired signal.

One known image-rejecting mixer uses a tracking bandpass filter to reject the image frequency before the RF signal is input to the mixer. The center frequency of the filter is made to track the local oscillator frequency so that all frequencies outside the desired sideband frequency are attenuated. Then the output of the mixer is subjected to further filtering to reject the image frequency.

Another known architecture uses two mixers in quadrature to produce in-phase and quadrature components of the RF signal. The outputs of the mixers are then input to a polyphase filter. The polyphase filter has the desirable quality that it is asymmetric so that it can pass the desired sideband and attenuate the image frequency. However known mixer architectures using polyphase filters add noise due to the resistors used in the filter. Furthermore to increase the amount of image rejection, higher order polyphase filters may be used. However these higher order filters require additional resistors for each added filter stage, increasing noise. What is needed then is a new image reject filter architecture for RF receivers with high image rejection but low noise.

BRIEF SUMMARY

Accordingly the present invention provides, in one form, a receiver including a transconductance mixer, a polyphase filter, and a transimpedance amplifier. The transconductance mixer mixes a radio frequency (RF) voltage signal into a current signal having a plurality of phases using a local oscillator signal. The polyphase filter filters the current signal to provide a filtered current signal. The transimpedance amplifier converts the filtered current signal into an output voltage signal.

In another form the present invention provides an image reject mixer including a transconductance mixer, a polyphase filter, and a transimpedance amplifier. The transconductance mixer has a signal input terminal for receiving an RF voltage signal, a mixing input terminal for receiving a local oscillator signal, and an output terminal for providing a current signal. The polyphase filter has an input terminal for receiving the current signal, and an output terminal for providing a filtered current signal. The transimpedance amplifier has an input terminal coupled to the output terminal of the polyphase filter, and an output terminal for providing a mixed voltage signal.

In yet another form the present invention provides signal processing circuitry including a first circuit, a polyphase filter, and a second circuit. The first circuit provides a current signal to an output terminal thereof. The polyphase filter has an input terminal coupled to the output terminal of the first circuit for receiving the current signal, and an output terminal for providing a filtered current signal. The second circuit has an input terminal coupled to the output terminal of the polyphase filter and an output terminal. The second circuit processes the filtered current signal to provide an output signal on the output terminal thereof. The signal processing circuit thereby operates the polyphase filter in a current mode.

In still another form, the present invention provides a method of mixing a radio frequency (RF) voltage signal to an output voltage signal at another frequency while rejecting an image frequency thereof. The RF voltage signal is mixed with a local oscillator signal to provide a current signal. The current signal is filtered using a polyphase filter to provide a filtered current signal. The filtered current signal is converted into the output voltage signal.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

Figure 1:
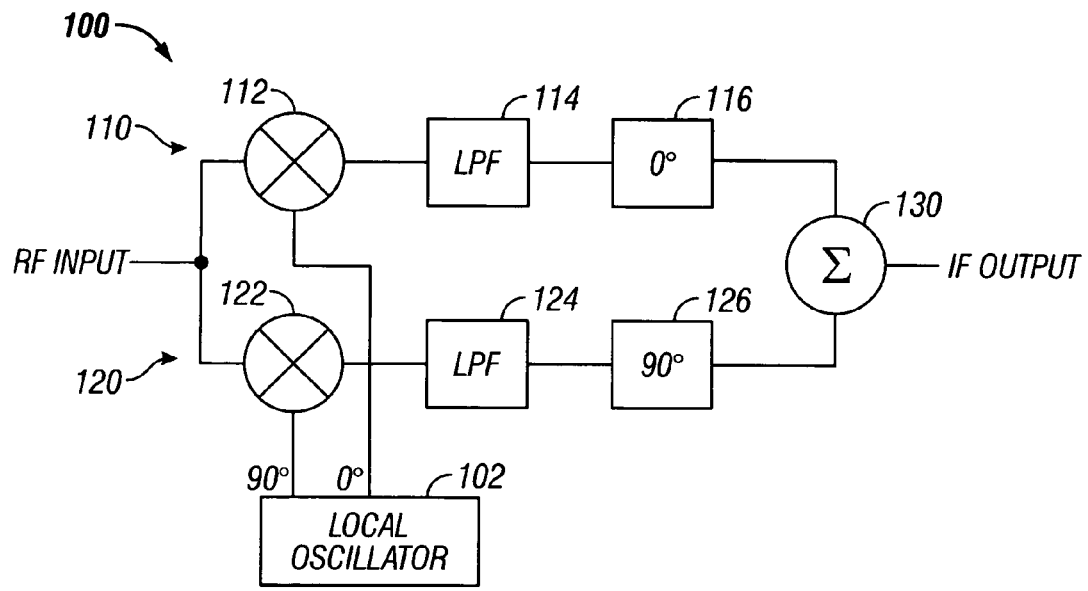
FIG. 1 illustrates in partial block diagram and partial schematic form an image reject mixer known in the prior art.

FIG. 1 illustrates in partial block diagram and partial schematic form an image reject mixer 100 known in the prior art. Image reject mixer 100 includes a local oscillator 102 that generates an in-phase local oscillator signal labeled "0°" and a quadrature local oscillator signal labeled "90°". Alternatively the phase shifts could be +45° and −45° respectively. These signals are utilized in an in-phase path 110 and a quadrature path 120. In-phase path 110 includes a multiplier 112, a lowpass filter 114, and a phase shifter 116. Multiplier 112 that has a first input terminal for receiving a radio frequency (RF) input signal labeled "RF INPUT", a second input terminal for receiving the in-phase local oscillator signal, and an output terminal. Lowpass filter 114 has an input terminal connected to the output terminal of multiplier 112, and an output terminal. Phase shifter 116 has an input terminal connected to the output terminal of lowpass filter 114, and an output terminal. Quadrature path 120 includes a multiplier 122, a lowpass filter 124, and a phase shifter 126. Multiplier 122 that has a first input terminal for receiving the RF INPUT signal, a second input terminal for receiving the quadrature local oscillator signal, and an output terminal. Lowpass filter 124 has an input terminal connected to the output terminal of multiplier 122, and an output terminal. Phase shifter 126 has an input terminal connected to the output terminal of lowpass filter 124, and an output terminal. Image reject mixer 100 also includes a summing device 130 having a first input terminal connected to the output terminal of phase shifter 116, a second input terminal connected to the output terminal of phase shifter 126, and an output terminal for providing a signal labeled "IF OUTPUT" at an output terminal of image reject mixer 100.

Image reject mixer 100 employs a complex mixer architecture that exploits the relationship between the desired signal and the undesired image to cancel the image during the mixing process. Thus, no preselector filter is needed, at least in principle, and the design of the overall architecture can proceed with diminished concern for the image problem. The RF input signal is provided to the input of two multipliers 112 and 122, and two local oscillator signals in quadrature drive the other ports of multipliers 112 and 122. The desired difference frequency component is the same in both mixer outputs, but the image terms are in quadrature. A constant gain, frequency independent phase shifter 126 allows the simple addition of two signals to cancel the undesired image terms. Note that image reject mixer 100 uses lowpass filters 114 and 124 to select the difference frequency component, but a similar technique could be applied to select the sum frequency component instead.

Image reject mixer 100 has conventionally been implemented by two techniques. In the first technique summing device 130 sums current signals. The in-phase and quadrature signals at the outputs of delay elements 116 and 126, respectively, would first be converted into currents using resistors or transconductors. Thus this technique required additional active circuits for voltage-to-current conversion. These additional circuits not only consume additional power but also degrade the noise figure as well as the linearity of the mixer. Furthermore the mixer may require another set of buffers at the inputs to filters 114 and 124 to maintain sufficient voltage gain for the preceding mixers. Thus when using this technique image reject mixer 100 consumes a significant amount of power due to the additional buffers and/or transconductors. Furthermore the number of components involved makes it difficult to achieve an acceptably low noise figure and acceptably high linearity. In addition this design requires good amplitude matching and good phase matching between the active circuits in order to maintain a good image rejection ratio.

Because of these drawbacks many image reject mixers have also been realized by another technique. This other technique leaves the outputs of mixers 112 and 122 in the complex domain (each existing as a signal with an in-phase component and a quadrature component) for subsequent processing by a digital signal processor (DSP). However this technique requires a DSP and thus is not suitable for lower cost applications.

Figure 2:
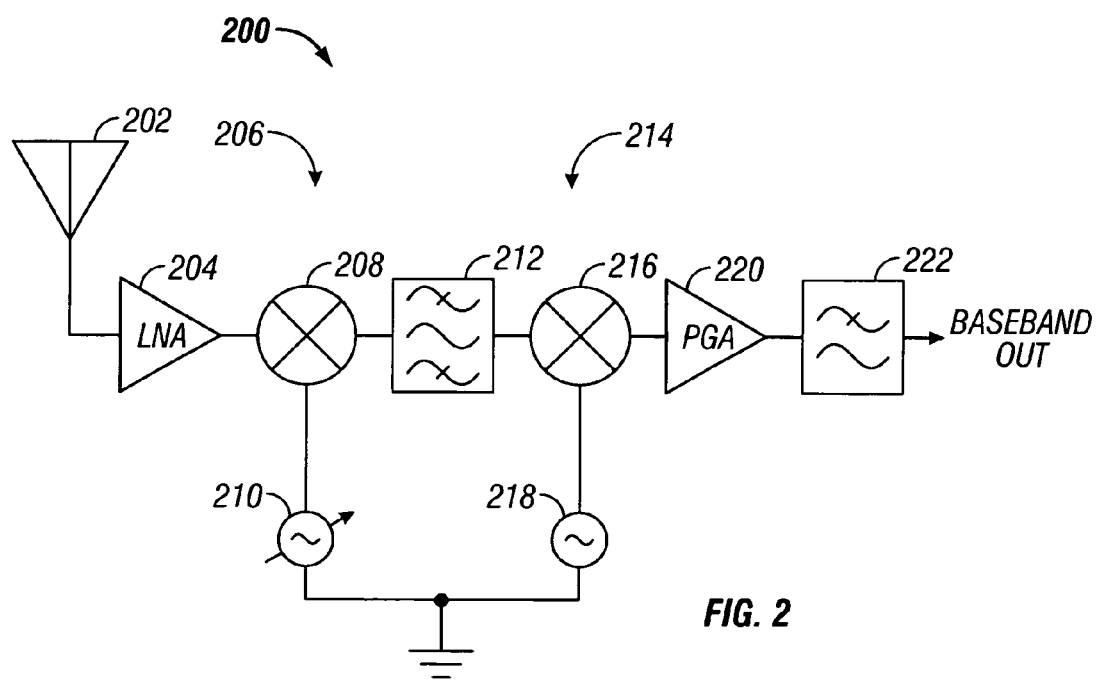
FIG. 2 illustrates in partial block diagram and partial schematic form a radio receiver having an image reject mixer according to the present invention.

FIG. 2 illustrates in partial block diagram and partial schematic form a radio receiver 200 having an image reject mixer 208 according to the present invention. Receiver 200 is a superheterodyne receiver that includes generally an antenna 202, a low noise amplifier labeled "LNA" 204, an RF to IF mixer 206, a bandpass filter 212, an IF-to-baseband mixer 214, a programmable gain amplifier labeled "PGA" 220, and a lowpass filter 222. Amplifier 204 has an input terminal connected to antenna 202, and an output terminal, and amplifies a broadband signal received on antenna 202 to provide an amplified signal to the output terminal thereof.

RF-to-IF mixer 206 mixes the amplified signal to IF as follows. RF-to-IF mixer 206 includes an image reject mixer 208 and a tunable local oscillator 210. Image reject mixer 208 has a first input terminal connected to the output terminal of amplifier 204, a second input terminal, and an output terminal. Tunable local oscillator 210 has a tuning input terminal and an output terminal that provides an RF local oscillator (LO) signal referenced to a ground voltage received at a ground terminal thereof. The RF LO signal is selected by the tuning input to have a frequency such that a desired channel is mixed from RF to a selected IF, which is also the center frequency of bandpass filter 212.

Bandpass filter 212 has an input terminal connected to the output terminal of image reject mixer 208, and an output terminal for providing an output signal with significant signal energy in a passband centered around the chosen IF, and with significant attenuation of signal energy in a stopband outside the passband. In receiver 200 bandpass filter 212 is implemented with a surface acoustic wave (SAW) filter that provides excellent bandpass characteristics.

This signal at the output of bandpass filter 212 is then mixed to baseband in IF-to-baseband mixer 214. IF-to-baseband mixer 214 includes a mixer 216 and a local oscillator 218. Mixer 216 has a first input terminal connected to the output terminal of bandpass filter 212, a second input terminal, and an output terminal. Local oscillator 218 provides an IF LO signal between an output terminal thereof and ground received at a ground terminal. The IF LO signal is selected to have an output frequency chosen to mix the selected IF signal to baseband, and mixer 216 thus provides the output signal thereof at baseband.

Amplifier 220 is provided to amplify the baseband signal to a desired level, and has an input terminal connected to the output terminal of mixer 216, and an output terminal. Filter 222 has an input terminal connected to the output terminal of amplifier 220, and an output terminal for providing an output signal of receiver 200 labeled "BASEBAND OUT".

Receiver 200 includes special image reject mixer 208 in order to reduce noise and provide high signal-to-noise ratio (SNR). Image reject mixer 208 is better understood with reference to FIG. 3, which illustrates in partial block diagram and partial schematic form a portion 300 of radio receiver 200 of FIG. 2 including image reject mixer 208. Portion 300 includes generally LNA 204, local oscillator 210, and image reject mixer 208 all shown in greater detail. LNA 204 has positive and negative input terminals for receiving a differential RF input signal formed respectively by signals labeled "RF_IP" and "RF_IN" and received, directly or indirectly, from an antenna. In one embodiment, the signal is received directly from an antenna and the elements shown in FIG. 2 are all implemented on a single silicon chip. Alternatively the receiver may have a second, off-chip LNA that is connected to the antenna and amplifies the received RF signal to form signals RF_IP and RF_IN. LNA 204 provides a differential RF voltage signal having a positive component labeled "RFP" and a negative component labeled "RFN" respectively at positive and negative output terminals thereof. Note that LNA 204 also includes an input terminal, not shown in FIG. 3, associated with an automatic gain control function that is used to alter the gain of LNA 204 but this aspect of receiver 200 is not important to understanding the invention and will not be described further.

Local oscillator 210 has first and second differential output terminals for providing first and second mixing clock signal pairs including a first pair formed by a positive in-phase mixing signal labeled "LOIP" and a negative in-phase mixing signal labeled "LOIN", and a second pair formed by a positive quadrature mixing signal labeled "LOQP" and a negative quadrature mixing signal labeled "LOQN". Local oscillator 210 provides the quadrature mixing signal at the same frequency as the in-phase mixing signal but delayed in phase by 90°.

Image reject mixer 208 more particularly includes a transconductance mixer 310, a polyphase filter 320, and a transconductance amplifier 330. Transconductance mixer 310 includes mixing cells 312 and 314. Mixing cell 312 has first and second voltage input terminals for respectively receiving signals RFP and RFN, first and second mixing input terminals for receiving signals LOIP and LOIN, and first and second current output terminals. Mixing cell 314 has first and second voltage input terminals for respectively receiving signals RFP and RFN, first and second mixing input terminals for receiving signals LOQP and LOQN, and first and second current output terminals.

Polyphase filter 320 has a first input terminal connected to the first output terminal of mixing cell 312, a second input terminal connected to the second output terminal of mixing cell 312, a third input terminal connected to the first output terminal of mixing cell 314, a fourth input terminal connected to the second output terminal of mixing cell 314, and provides a differential current signal formed by a positive current component labeled "IP" provided to a positive output terminal and a negative current component labeled "IN" provided to a negative output terminal.

Transimpedance amplifier 330 has a positive input terminal connected to the positive output terminal of polyphase filter 226 for receiving current IP therefrom, a negative input terminal connected to the negative output terminal of polyphase filter 226 for receiving current IN therefrom, a positive output terminal for providing an output voltage signal labeled "OP", and a negative output terminal for providing an output voltage signal labeled "ON".

In operation, image reject mixer 208 mixes the amplified input signal received from LNA 204 to a desired intermediate frequency. In the illustrated receiver the desired intermediate frequency is chosen to mix a desired channel down to a fixed intermediate frequency (IF). Polyphase filter 320 is used to pass the desired signal (in this case the upper sideband) and reject the image frequency (the lower sideband). In accordance with the present invention polyphase filter 320 operates in the current domain, which reduces the effect of noise caused by its resistors. Finally transimpedance amplifier 330 buffers the output of polyphase filter 320 and converts the output current signal into a voltage for subsequent processing in SAW filter 212.

Operating polyphase filter 320 in the current mode instead of the voltage mode reduces thermal noise. The root-mean-square (rms) value of the thermal noise voltage $V_n$ is given by the expression:

$$V_n^2 = 4KTRB \qquad [1]$$

in which K is Boltzmann's constant, T is resistor temperature, R is the resistance of the resistor, and B is the bandwidth. The rms value of the thermal noise current $I_n$ is given by the expression:

$$I_n^2 = \frac{4KTB}{R} \qquad [2]$$

Thus resistors in polyphase filter 320 contribute less noise when polyphase filter 320 operates in current mode. Furthermore mixer cells 312 and 314 are conveniently implemented using so-called double balanced mixer cells that naturally produce current outputs. Amplifier 330, needed to buffer the output of polyphase filter 320, is implemented as a transimpedance amplifier in order to represent the IF signal as a differential voltage, a form suitable for input to SAW filter 212.

FIGS. 4-7 illustrate pertinent portions of the actual circuits used for the components of mixer 208. Similar circuits, known to those of ordinary skill in the art, may be substituted for the disclosed circuits in other embodiments. However mixer 208 includes a special sideband select feature that will be described in greater detail below.

Figure 3:
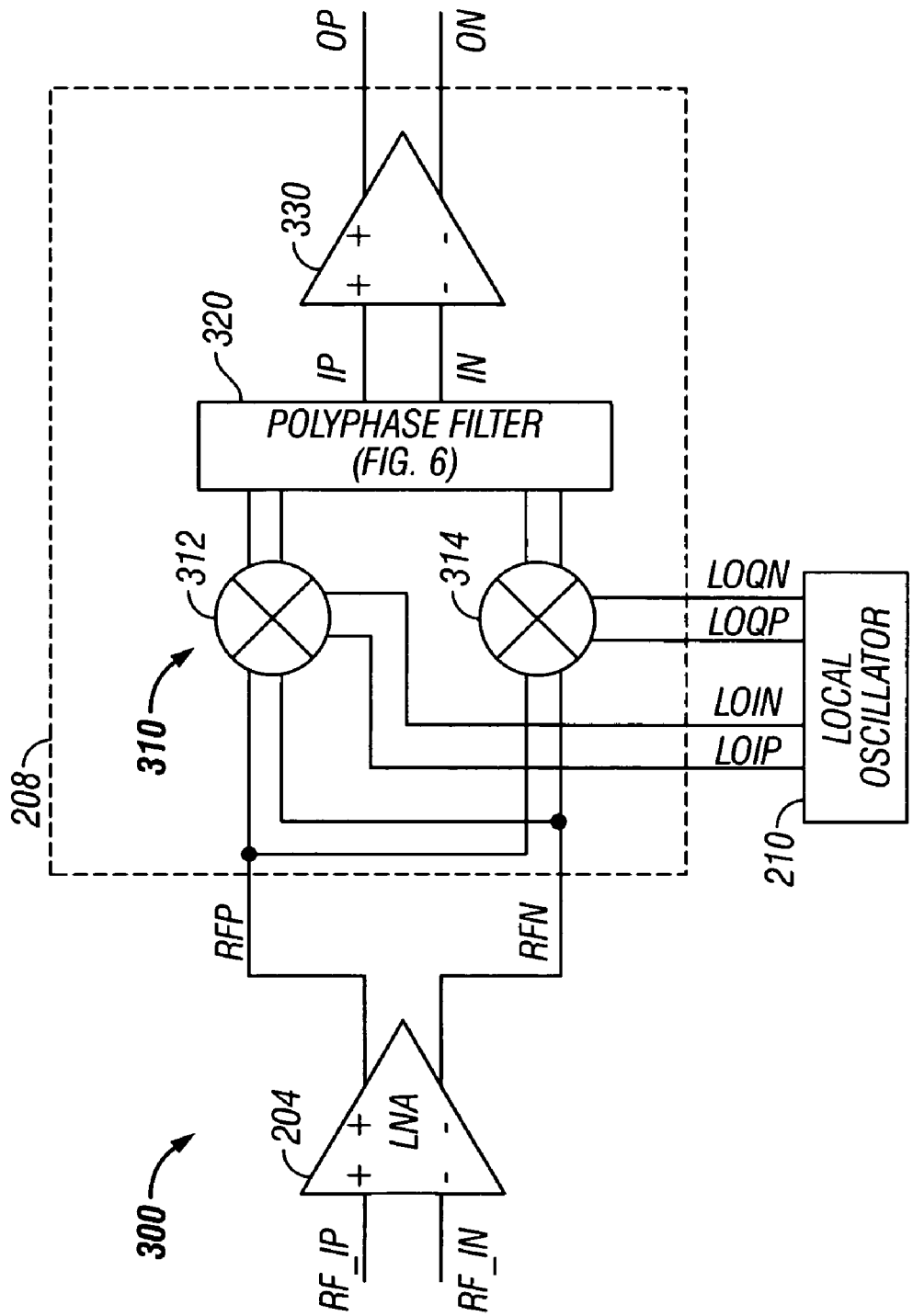
FIG. 3 illustrates in partial block diagram and partial schematic form a portion of the radio receiver of FIG. 2 including the image reject mixer.
Figure 4:
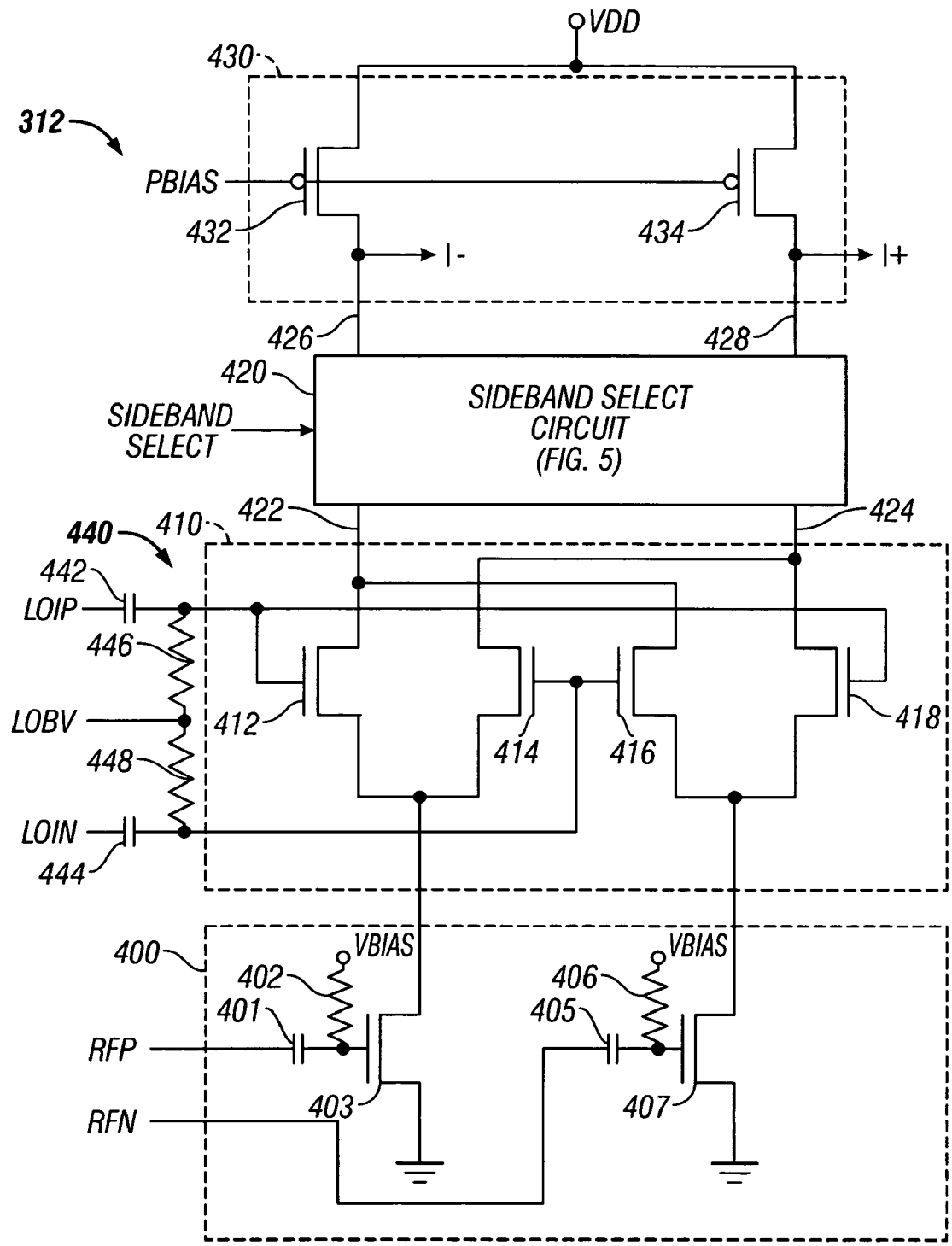
FIG. 4 illustrates in partial block diagram and partial schematic form one of the mixer cells of FIG. 3.

FIG. 4 illustrates in partial block diagram and partial schematic form mixer cell 312 of FIG. 3. Mixer cell 312 receives differential input voltage formed between signals RFP and RFN and mixes the differential input voltage to the selected IF using a local oscillator signal LOIP and LOIN to provide a differential output current labeled "I+" and "I". Mixer cell 314 is structurally similar to mixer cell 312 but mixes signals RFP and RFN to the selected IF using quadrature local oscillator signals LOQP and LOQN, to provide a corresponding differential output current designated "Q+" and "Q−".

Mixer cell 312 includes a transconductance portion 400, a double-balanced mixer 410, a sideband select circuit 420, a bias current portion 430, and a local oscillator clock input portion 440. Transconductance portion 400 includes a capacitor 401, a resistor 402, an N-channel MOS transistor 403, a capacitor 405, a resistor 406, and an N-channel MOS transistor 407. Capacitor 401 has a first terminal for receiving signal RFP, and a second terminal. Resistor 402 has a first terminal connected to a reference voltage terminal labeled "VBIAS", and a second terminal connected to the second terminal of capacitor 401. VDD is conventionally the more positive power supply voltage terminal in MOS integrated circuits and may have a voltage of approximately there volts when referenced to ground. Transistor 403 has a drain, a gate connected to the second terminal of capacitor 401, and a source connected to ground. Capacitor 405 has a first terminal for receiving signal RFN, and a second terminal. Resistor 406 has a first terminal connected to VBIAS, and a second terminal connected to the second terminal of capacitor 405. Transistor 407 has a drain, a gate connected to the second terminal of capacitor 405, and a source connected to ground. Transconductance portion 400 couples the time-varying portions (AC-couples) of the outputs from LNA 204 using capacitors 401 and 405 into transistors 403 and 407, respectively.

Local oscillator clock input portion 440 includes capacitors 442 and 444, and resistors 446 and 448. Capacitor 442 has a first terminal for receiving signal LOIP, and a second terminal. Capacitor 444 has a first terminal for receiving signal LOIN, and a second terminal. Resistor 446 has a first terminal connected to the second terminal of capacitor 442, and a second terminal receiving a reference voltage labeled "LOBV". Resistor 448 has a first terminal connected to the second terminal of resistor 446, and a second terminal connected to the second terminal of capacitor 444. Local oscillator clock input portion 440 AC-couples the local oscillator signal to the input of double-balanced mixer 410. Thus any common-mode voltage between LOIP and LOIN is rejected. However local oscillator clock input portion 440 also includes an input terminal for receiving reference voltage LOBV, which sets the common-mode voltage between the positive and negative input terminals of double-balanced mixer portion 410. This common mode voltage can be set to any appropriate value.

Double balanced mixer portion 410 includes N-channel metal-oxide-semiconductor (MOS) transistors 412, 414, 416, and 418. Transistor 412 has a first source/drain terminal connected to the drain of transistor 403, a gate connected to the second terminal of capacitor 442, and a second source/drain terminal connected to a node 422. Transistor 414 has a first source/drain terminal connected to the drain of transistor 403, a gate connected to the second terminal of capacitor 444, and a second source/drain terminal connected to a node 424. Transistor 416 has a first source/drain terminal connected to the drain of transistor 407, a gate connected to the second terminal of capacitor 444, and a second source/drain terminal connected to node 422. Transistor 418 has a first source/drain terminal connected to the drain of transistor 407, a gate connected to the second terminal of capacitor 442, and a second source/drain terminal connected to node 424. A double-balanced mixer architecture was chosen for its excellent mixing characteristics and immunity to asymmetries in the local oscillator signals.

Sideband select circuit 420 has first and second current input terminals connected to nodes 422 and 424, first and second current output terminals connected to respective output nodes 426 and 428, and an input terminal for receiving a control signal labeled "SIDEBAND SELECT". Sideband select portion 420 selectively allows transconductance mixer 310 to select either the lower sideband or the upper sideband, and to reject the other. This feature adds flexibility and is useful, for example, to allow receivers to reject the sideband with the largest interfering signal energy. The structure and operation of sideband select circuit 420 will be explained in more detail with respect to FIG. 5 below.

Bias current portion 430 includes P-channel MOS transistors 432 and 434. Transistor 432 has a source connected to VDD, a gate for receiving a bias signal labeled "PBIAS", and a drain connected to node 426. Transistor 434 has a source connected to VDD, a gate for receiving bias signal PBIAS, and a drain connected to node 428. Bias signal PBIAS is chosen to have a level that biases P-channel transistors 432 and 434 to supply a relatively-constant current over changes in drain-to-source voltage. Double-balanced mixer 410 then selectively diverts the current in response to input voltages RFP and RFN and the AC-coupled local oscillator signals.

Figure 5:
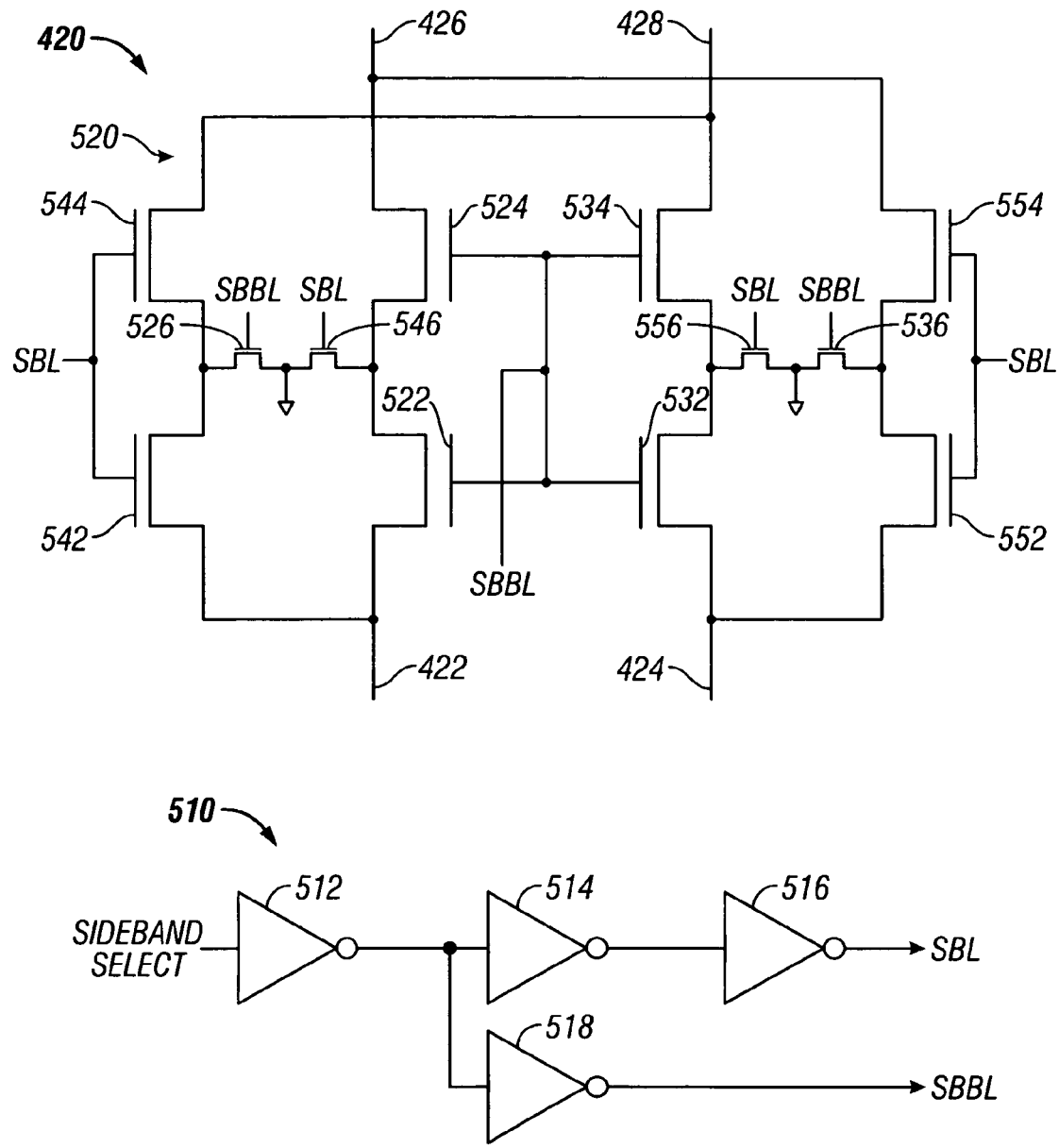
FIG. 5 illustrates in partial logic diagram and partial schematic form the sideband select circuit of FIG. 4.

FIG. 5 illustrates in partial logic diagram and partial schematic form sideband select circuit 420 of FIG. 4. Sideband select circuit 420 includes a control signal portion 510 and a polarity switch 520. Control signal portion 510 includes inverters 512, 514, 516, and 518. Inverter 512 has an input terminal for receiving signal SIDEBAND SELECT, and an output terminal. Inverter 514 has an input terminal connected to the output terminal of inverter 512, and an output terminal. Inverter 516 has an input terminal connected to the output terminal of inverter 514, and an output terminal for providing a signal labeled "SBL". Inverter 518 has an input terminal connected to the output terminal of inverter 512, and an output terminal for providing a signal labeled "SBBL". Control signal portion 510 provides signal SBL at a logic low level and signal SBL at a logic high lever when SIDEBAND SELECT is at a low level, signifying the selection of the lower sideband and the rejection of the upper sideband. Control signal portion 510 provides signal SBL at a logic low level and signal SBL at a logic high lever when SIDEBAND SELECT is at a high level, signifying the selection of the upper sideband and the rejection of the lower sideband.

Polarity switch 520 includes N-channel MOS transistors 522, 524, 526, 532, 534, 536, 542, 544, 546, 552, 554, and 556. Transistors 522 and 524 are connected in series between nodes 422 and 426 and receive signal SBBL on their gates. Transistors 532 and 534 are connected in series between nodes 424 and 428 and receive signal SBBL on their gates. Transistors 542 and 544 are connected in series between nodes 422 and 428 and receive signal SBL on their gates. Transistors 552 and 554 are connected in series between nodes 424 and 426 and receive signal SBL on their gates. Transistor 526 is connected between the common connection of transistors 542 and 544 and ground and has a gate receiving signal SBBL. Transistor 536 is connected between the common connection of transistors 552 and 554 and ground and has a gate receiving signal SBBL. Transistor 546 is connected between the common connection of transistors 522 and 524 and ground and has a gate receiving signal SBL. Transistor 556 is connected between the common connection of transistors 532 and 534 and ground and has a gate receiving signal SBL.

In operation, polarity switch 520 selectively reverses the polarity of the output currents of mixer cell 312. If SIDEBAND SELECT is low and thus selects the lower sideband, signal SBL is high and signal SBBL is low. Thus current terminal 422 is connected to current terminal 426 and current terminal 424 is connected to current terminal 428. At the same time, transistors 526 and 536 are conductive to connect the interconnection points of transistors 542 and 544, and 552 and 554 to ground. Transistors 542, 544, 546, 552, 554, and 556 are all nonconductive. Conversely, if SIDEBAND SELECT is high and thus selects the upper sideband, signal SBL is low and signal SBBL is high. Thus current terminal 422 is connected to current terminal 428 and current terminal 424 is connected to current terminal 426. At the same time, transistors 546 and 556 are conductive to connect the interconnection points of transistors 522 and 524, and 532 and 534 to ground. Transistors 522, 524, 526, 532, 534, and 536 are all nonconductive.

Sideband select circuit 420 adds flexibility to image reject mixer 208 by allowing the sideband to be chosen. Note that mixer cell 314 is similar to mixer cell 312 but it does not include a polarity reversing circuit. Instead each current path includes two series connected N-channel transistors that are always conductive. Alternatively mixer cell 314 could include the sideband select circuit and achieve the same result.

Figure 6:
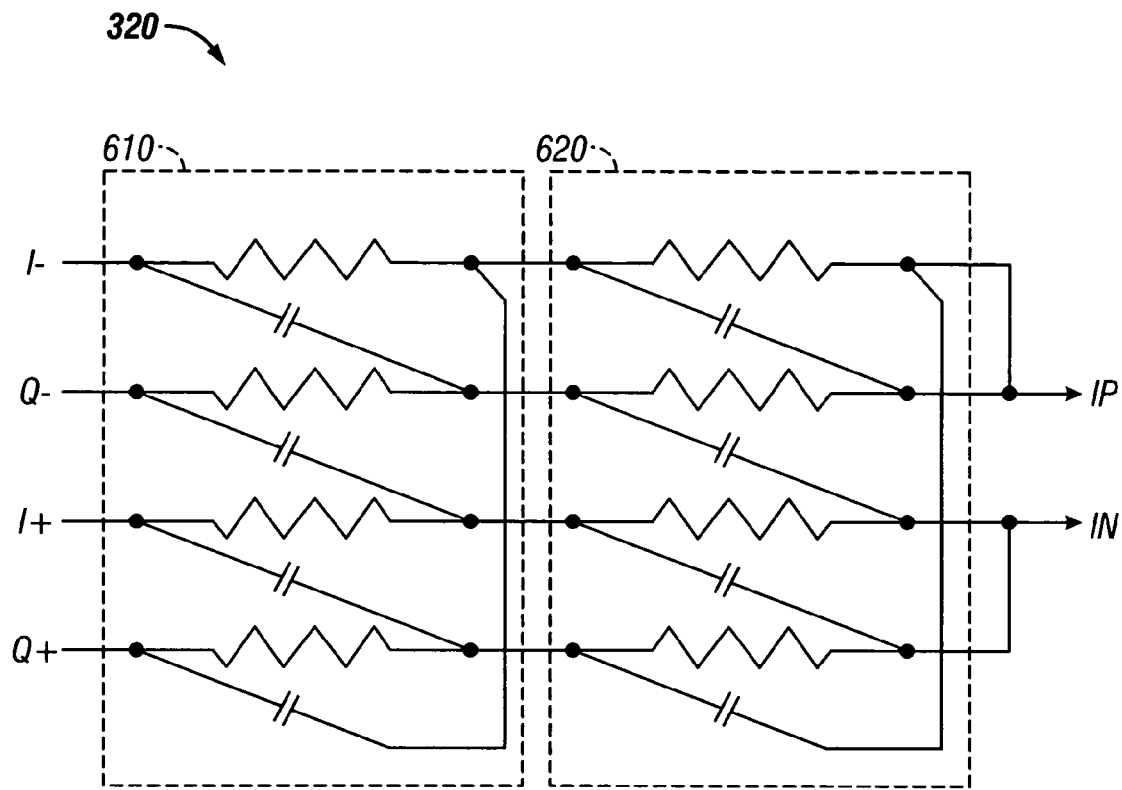
FIG. 6 illustrates in schematic form the polyphase filter of FIG. 3.

FIG. 6 illustrates in schematic form polyphase filter 320 of FIG. 3. Polyphase filter 320 is a second-order polyphase filter having a first filter section 610 and a structurally identical second filter section 620. Filter section 610 has four input terminals corresponding to four phases of the mixed current signal, and each delayed in phase by 90° between adjacent input terminals. Thus the first through fourth input terminals receive signals I−, Q−, I+, and Q+, respectively. Filter section 610 includes a series resistor between each input terminal and its corresponding output terminal, and a capacitor connected between an input terminal and an output terminal of a corresponding adjacent but delayed phase. The first through fourth output terminals of filter section 610 are respectively connected to first through fourth input terminals of filter section 620. Each output terminal of filter section 620 corresponds to the phase at the input terminal of filter section 610 but delayed by 180°. Since the outputs of filter section 620 are currents, they can be advantageously summed by simple connections. Thus the first and second output terminals of section 620 are summed to provide positive output current IP of the differential current pair, and the third and fourth terminals of section 620 are summed to provide negative output current IN of the differential current pair.

Figure 7:
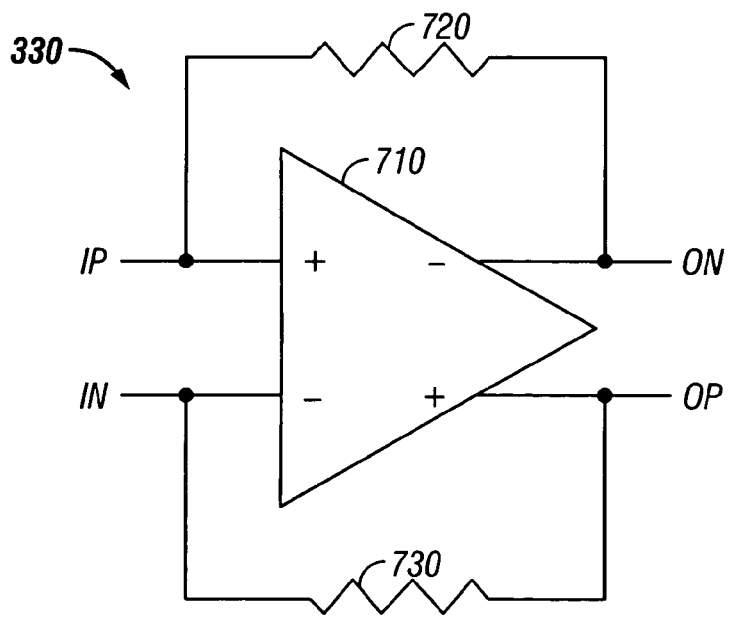
FIG. 7 illustrates in partial block diagram and partial schematic form the transimpedance amplifier of FIG. 3.

FIG. 7 illustrates in partial block diagram and partial schematic form transimpedance amplifier 330 of FIG. 3. As shown in FIG. 6 amplifier 330 includes a differential amplifier 710 and resistors 720 and 730. Differential amplifier 710 has a positive input terminal for receiving signal IP, a negative input terminal for receiving signal IN, a negative output terminal for providing signal ON, and a positive output terminal for providing signal OP. Resistor 720 is connected between the positive input terminal and negative output terminal of differential amplifier 710. Resistor 730 is connected between the negative input terminal and positive output terminal of differential amplifier 710.

Figure 8:
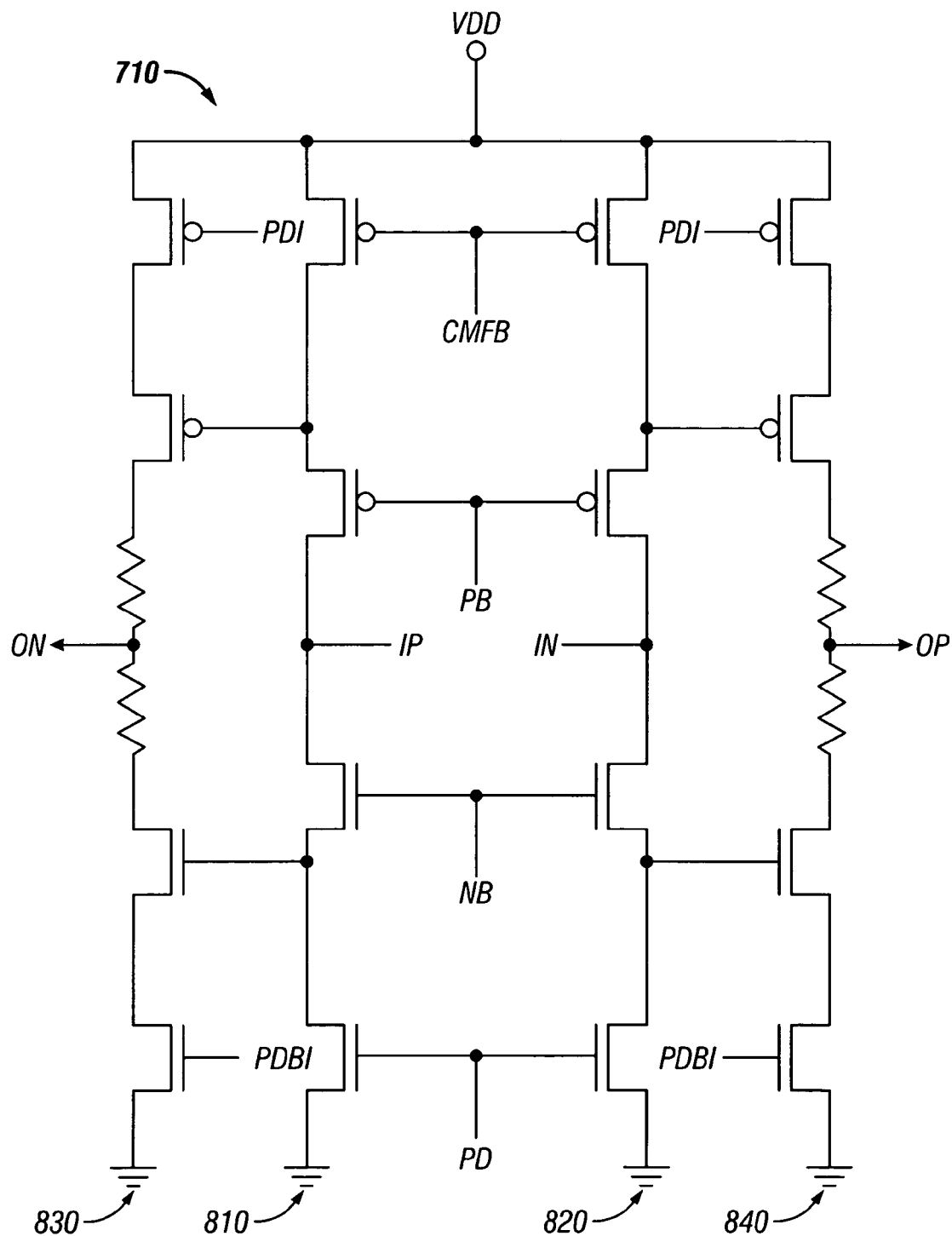
FIG. 8 illustrates in schematic form the differential amplifier of FIG. 7.

FIG. 8 illustrates in schematic form differential amplifier 710 of FIG. 7. Differential amplifier 710 includes two input portions 810 and 820 and two output portions 830 and 840. Each of input portions 810 and 820 converts its respective input current into corresponding voltage pairs having components that are level shifted from one another. Each of output portions 830 and 840 utilizes a push-pull structure to convert the voltage pairs into a corresponding single voltage, and increases the gain. Differential amplifier 710 also includes a power down feature controlled by signals labeled "PD", "PDI", and "PDBI". In addition differential amplifier 710 includes a common-mode feedback input terminal for adjusting the common-mode voltage of the input signal.

Thus there has been described an image reject mixer having high image rejection with low noise. Such a mixer is useful, for example, in the RF-to-IF mixing step of a superheterodyne receiver. The illustrated image reject mixer includes a transconductance mixer, a polyphase filter operating in current mode, and a transimpedance amplifier. Operating the polyphase filter in current mode reduces the effect of resistor noise.

While at least one exemplary embodiment has been presented in the foregoing detailed description, it should be appreciated that a vast number of variations exist. For example the circuits illustrated above with respect to FIGS. 4-7 may be replaced with other corresponding known circuits. Also the image reject mixer could be used in a different mixing step besides the illustrated RF-to-IF mixer. Thus it should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A receiver comprising:
   a transconductance mixer that mixes a radio frequency (RF) voltage signal into a current signal having a plurality of phases using a local oscillator signal, said current signal comprising an in-phase current signal and a quadrature current signal;
   a polyphase filter that filters said current signal to provide a filtered current signal; and
   a transimpedance amplifier that converts said filtered current signal into an output voltage signal.

2. The receiver of claim 1 further comprising a low noise amplifier that amplifies an RF input signal to provide said RF voltage signal.

3. The receiver of claim 1 further comprising a local oscillator that provides said local oscillator signal.

4. The receiver of claim 1 wherein said RF voltage signal comprises a differential voltage signal and said current signal further comprises an in-phase differential current signal and a quadrature differential current signal.

5. The receiver of claim 4 wherein said transconductance mixer comprises:
   a first mixer cell having first and second input terminals for respectively receiving positive and negative components of said in differential voltage signal, a mixing input terminal for receiving an in-phase local oscillator signal, and an output terminal for providing said in-phase differential current signal; and
   a second mixer cell having first and second input terminals for respectively receiving positive and negative components of said differential voltage signal, a mixing input terminal for receiving a quadrature local oscillator signal, and an output terminal for providing said quadrature differential current signal.

6. The receiver of claim 5 wherein each of said first and second mixer cells comprises a double balanced mixer cell.

7. The receiver of claim 5 wherein one of said first and second mixer cells selectively reverses a polarity of a corresponding differential current in response to a sideband select signal.

8. The receiver of claim 1 wherein said polyphase filter is a second order polyphase filter.

9. The receiver of claim 1 wherein said transconductance mixer, said polyphase filter, and said transimpedance amplifier are all implemented together in a single integrated circuit.

10. The receiver of claim 1 wherein said output voltage signal is characterized as being an intermediate frequency (IF) signal, and the receiver further comprises circuitry that converts said IF signal into a baseband output signal.

11. The receiver of claim 10 wherein said circuitry comprises:
   a bandpass filter having a passband centered around an intermediate frequency corresponding to said output voltage signal.

12. The receiver of claim 11 wherein said bandpass filter comprises a surface acoustic wave (SAW) filter.

13. The receiver of claim 11 wherein said circuitry further comprises:
a baseband mixer that converts an output of said bandpass filter to baseband.

14. The receiver of claim 13 wherein said circuitry further comprises:
a programmable gain amplifier that amplifies an output of said baseband mixer; and
a lowpass filter that filters an output of said programmable gain amplifier to provide said baseband output signal.

15. An image reject mixer comprising:
a transconductance mixer having a signal input terminal for receiving an RF voltage signal, a mixing input terminal for receiving a local oscillator signal, and an output terminal for providing a current signal, said current signal comprising an in-phase current signal and a quadrature current signal;
a polyphase filter having an input terminal for receiving said current signal, and an output terminal for providing a filtered current signal; and
a transimpedance amplifier having an input terminal coupled to said output terminal of said polyphase filter, and an output terminal for providing a mixed voltage signal.

16. The image reject mixer of claim 15 wherein said RF voltage signal comprises a differential voltage signal, and said current signal further comprises an in-phase differential current signal and a quadrature differential current signal.

17. The image reject mixer of claim 16 wherein said transconductance mixer comprises:
a first mixer cell having first and second input terminals for respectively receiving positive and negative components of said differential voltage signal, a mixing input terminal for receiving an in-phase local oscillator signal, and an output terminal for providing said in-phase differential current signal; and
a second mixer cell having first and second input terminals for respectively receiving said positive and negative components of said differential voltage signal, a mixing input terminal for receiving a quadrature local oscillator signal, and an output terminal for providing said quadrature differential current signal.

18. The image reject mixer of claim 17 wherein each of said first and second mixer cells comprises a double balanced mixer cell.

19. The image reject mixer of claim 17 wherein one of said first and second mixer cells selectively reverses a polarity of a corresponding differential current in response to a sideband select signal.

20. The image reject mixer of claim 16 wherein said polyphase filter has first through fourth input terminals for respectively receiving positive and negative components of each of said in-phase differential current signal and said quadrature differential current signal, and first through fourth output terminals.

21. The image reject mixer of claim 20 wherein said polyphase filter sums signals at said first and second output terminals to provide a positive real output current, and sums signals at said third and fourth output terminals to provide a negative real output current.

22. The image reject mixer of claim 15 wherein said polyphase filter is a second order polyphase filter.

23. Signal processing circuitry comprising:
a transconductance mixer that mixes an input signal with a local oscillator signal and that provides a current signal to an output terminal thereof, said current signal comprising an in-phase current signal and a quadrature current signal;
a polyphase filter having an input terminal coupled to said output terminal of said transconductance mixer for receiving said current signal, and an output terminal for providing a filtered current signal; and
a second circuit having an input terminal coupled to said output terminal of said polyphase filter and an output terminal, said second circuit processing said filtered current signal to provide an output signal on said output terminal thereof,
the signal processing circuitry thereby operating said polyphase filter in a current mode.

24. The signal processing circuitry of claim 23 wherein said transconductance mixer further has a signal input terminal for receiving an RF voltage signal, and a mixing input terminal for receiving said local oscillator signal.

25. The signal processing circuitry of claim 24 wherein said RF voltage signal comprises a differential voltage signal, and said current signal further comprises an in-phase differential current signal and a quadrature differential current signal.

26. The signal processing circuitry of claim 25 wherein said transconductance mixer comprises:
a first mixer cell having first and second input terminals for respectively receiving positive and negative components of said differential voltage signal, a mixing input terminal for receiving an in-phase local oscillator signal, and an output terminal for providing said in-phase differential current signal; and
a second mixer cell having first and second input terminals for respectively receiving said positive and negative components of said differential voltage signal, a mixing input terminal for receiving a quadrature local oscillator signal, and an output terminal for providing said quadrature differential current signal.

27. The signal processing circuitry of claim 26 wherein each of said first and second mixer cells comprises a double balanced mixer cell.

28. The signal processing circuitry of claim 26 wherein one of said first and second mixer cells selectively reverses a polarity of a corresponding differential current in response to a sideband select signal.

29. The signal processing circuitry of claim 23 wherein said polyphase filter has first through fourth input terminals for respectively receiving positive and negative components of each of an in-phase differential current signal and a quadrature differential current signal, and first through fourth output terminals.

30. The signal processing circuitry of claim 29 wherein said polyphase filter sums signals at said first and second output terminals to provide a positive real output current, and sums signals at said third and fourth output terminals to provide a negative real output current.

31. The signal processing circuitry of claim 23 wherein said polyphase filter is a second order polyphase filter.

32. The signal processing circuitry of claim 23 wherein said second circuit comprises a buffer.

33. The signal processing circuitry of claim 32 wherein said buffer is characterized as being a transimpedance amplifier.

34. A method of mixing a radio frequency (RF) voltage signal to an output voltage signal at another frequency while rejecting an image frequency thereof, comprising the steps of:

mixing the RF voltage signal with a local oscillator signal to provide a current signal, said current signal comprising an in-phase current signal and a quadrature current signal;

filtering said current signal using a polyphase filter to provide a filtered current signal;

converting said filtered current signal into the output voltage signal.

35. The method of claim 34 wherein said step of mixing the RF voltage signal comprises the steps of:

mixing the RF voltage signal with said local oscillator signal using a double balanced mixer.

36. The method of claim 34 wherein said step of mixing the RF voltage signal comprises the steps of:

mixing the RF voltage signal with an in-phase local oscillator signal to provide said in-phase current signal; and mixing the RF voltage signal with a quadrature local oscillator signal to provide said quadrature current signal.

37. The method of claim 36 wherein said step of filtering comprises the steps of:

filtering said in-phase current signal and said quadrature current signal to provide an in-phase filtered current signal and a quadrature filtered current signal; and summing said in-phase filtered current signal and said quadrature filtered current signal to provide the filtered current signal.

38. The method of claim 34 wherein said step of converting said filtered current signal into the output voltage signal comprises the step of:

converting said filtered current signal into said output voltage signal using a transimpedance amplifier.

* * * * *